United States Patent
Hairapetian

(10) Patent No.: US 7,135,889 B2
(45) Date of Patent: *Nov. 14, 2006

(54) UNIVERSAL SINGLE-ENDED PARALLEL BUS

(75) Inventor: Armond Hairapetian, Glendale, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/856,476

(22) Filed: May 29, 2004

(65) Prior Publication Data

US 2004/0217777 A1 Nov. 4, 2004

Related U.S. Application Data

(63) Continuation of application No. 10/179,735, filed on Jun. 24, 2002, now Pat. No. 6,753,700, which is a continuation of application No. 09/605,091, filed on Jun. 27, 2000, now Pat. No. 6,424,177.

(60) Provisional application No. 60/141,354, filed on Jun. 28, 1999.

(51) Int. Cl.
*H03K 19/0175* (2006.01)

(52) U.S. Cl. ............................. 326/86; 326/82; 326/90

(58) Field of Classification Search ............ 326/82–83, 326/85, 89, 90, 93, 86; 327/77–78, 102, 327/530, 552, 554
See application file for complete search history.

(56) References Cited

U.S. PATENT DOCUMENTS

| | | | |
|---|---|---|---|
| 4,449,248 A | 5/1984 | Leslie et al. | |
| 4,519,068 A | 5/1985 | Krebs et al. | |
| 4,545,023 A | 10/1985 | Mizzi | |
| 4,680,787 A | 7/1987 | Marry | |
| 4,731,796 A | 3/1988 | Masterton et al. | |
| 4,737,975 A | 4/1988 | Shafer | |
| 4,761,822 A | 8/1988 | Maile | |
| 4,777,657 A | 10/1988 | Gillaspie | |
| 4,794,649 A | 12/1988 | Fujiwara | |
| 4,804,954 A | 2/1989 | Macnak et al. | |
| 4,807,282 A | 2/1989 | Kazan et al. | |
| 4,817,115 A | 3/1989 | Campo et al. | |
| 4,850,009 A | 7/1989 | Zook et al. | |
| 4,890,832 A | 1/1990 | Komaki | |
| 4,894,792 A | 1/1990 | Mitchell et al. | |
| 4,916,441 A | 4/1990 | Gombrich | |
| 4,964,121 A | 10/1990 | Moore | |
| 4,969,206 A | 11/1990 | Desrochers | |
| 4,977,611 A | 12/1990 | Maru | |
| 4,995,099 A | 2/1991 | Davis | |
| 5,008,879 A | 4/1991 | Fischer et al. | |
| 5,025,486 A | 6/1991 | Klughart | |
| 5,029,183 A | 7/1991 | Tymes | |
| 5,031,231 A | 7/1991 | Miyazaki | |

(Continued)

OTHER PUBLICATIONS

Bida, A Hybrid Wireless MAC Protocol Supporting Asynchronous and Synchronous MSDU Delivery Services, IEEE 802.11/91-92, Sep. 1991, pp. 1-46.

(Continued)

*Primary Examiner*—Anh Q. Tran
(74) *Attorney, Agent, or Firm*—Garlick Harrison & Markison; Shayne X. Short

(57) ABSTRACT

A high speed data communication system uses a single-ended bus architecture with a reference signal extracted from a differential periodic signal that is transmitted along with single-ended data. By using a periodic signal such a clock signal with approximately 50% duty cycle, a much more stable and accurate reference signal is established for receiving single-ended data.

20 Claims, 2 Drawing Sheets

U.S. PATENT DOCUMENTS

| | | | |
|---|---|---|---|
| 5,033,109 | A | 7/1991 | Kawano et al. |
| 5,055,659 | A | 10/1991 | Hendrick et al. |
| 5,055,660 | A | 10/1991 | Bertagna et al. |
| 5,081,402 | A | 1/1992 | Koleda |
| 5,087,099 | A | 2/1992 | Stolarczyk |
| 5,117,501 | A | 5/1992 | Childress et al. |
| 5,119,502 | A | 6/1992 | Kallin et al. |
| 5,121,408 | A | 6/1992 | Cai et al. |
| 5,123,029 | A | 6/1992 | Bantz et al. |
| 5,128,938 | A | 7/1992 | Borras |
| 5,134,347 | A | 7/1992 | Koleda |
| 5,142,573 | A | 8/1992 | Umezawa |
| 5,150,361 | A | 9/1992 | Wieczorek et al. |
| 5,152,006 | A | 9/1992 | Klaus |
| 5,153,878 | A | 10/1992 | Krebs |
| 5,175,870 | A | 12/1992 | Mabey et al. |
| 5,179,721 | A | 1/1993 | Comroe et al. |
| 5,181,200 | A | 1/1993 | Harrison |
| 5,230,084 | A | 7/1993 | Nguyen |
| 5,239,662 | A | 8/1993 | Danielson et al. |
| 5,241,542 | A | 8/1993 | Natarajan et al. |
| 5,241,691 | A | 8/1993 | Owen |
| 5,249,220 | A | 9/1993 | Moskowitz et al. |
| 5,249,302 | A | 9/1993 | Metroka et al. |
| 5,265,238 | A | 11/1993 | Canova, Jr. et al. |
| 5,265,270 | A | 11/1993 | Stengel et al. |
| 5,274,666 | A | 12/1993 | Dowdell et al. |
| 5,276,680 | A | 1/1994 | Messenger |
| 5,278,831 | A | 1/1994 | Mabey et al. |
| 5,289,469 | A | 2/1994 | Tanaka |
| 5,291,516 | A | 3/1994 | Dixon et al. |
| 5,293,639 | A | 3/1994 | Wilson et al. |
| 5,296,849 | A | 3/1994 | Ide |
| 5,297,144 | A | 3/1994 | Gilbert et al. |
| 5,323,392 | A | 6/1994 | Ishii et al. |
| 5,331,509 | A | 7/1994 | Kikinis |
| 5,349,649 | A | 9/1994 | Iijima |
| 5,361,397 | A | 11/1994 | Wright |
| 5,363,121 | A | 11/1994 | Freund |
| 5,373,149 | A | 12/1994 | Rasmussen |
| 5,373,506 | A | 12/1994 | Tayloe et al. |
| 5,390,206 | A | 2/1995 | Rein et al. |
| 5,392,023 | A | 2/1995 | D'Avello et al. |
| 5,406,615 | A | 4/1995 | Miller, II et al. |
| 5,406,643 | A | 4/1995 | Burke et al. |
| 5,418,837 | A | 5/1995 | Johansson et al. |
| 5,423,002 | A | 6/1995 | Hart |
| 5,426,637 | A | 6/1995 | Derby et al. |
| 5,428,636 | A | 6/1995 | Meier |
| 5,430,845 | A | 7/1995 | Rimmer et al. |
| 5,438,329 | A | 8/1995 | Gastouniotis et al. |
| 5,440,560 | A | 8/1995 | Rypinski |
| 5,465,081 | A | 11/1995 | Todd |
| 5,481,265 | A | 1/1996 | Russell |
| 5,481,562 | A | 1/1996 | Pearson et al. |
| 5,488,306 | A * | 1/1996 | Bonaccio .................... 324/539 |
| 5,512,853 | A * | 4/1996 | Ueno et al. ................. 327/333 |
| 5,533,029 | A | 7/1996 | Gardner |
| 5,535,373 | A | 7/1996 | Olnowich |
| 5,544,222 | A | 8/1996 | Robinson et al. |
| 5,579,487 | A | 11/1996 | Meyerson et al. |
| 5,584,048 | A | 12/1996 | Wieczorek |
| 5,628,055 | A | 5/1997 | Stein |
| 5,630,061 | A | 5/1997 | Richter et al. |
| 5,680,633 | A | 10/1997 | Koenck et al. |
| 5,732,346 | A | 3/1998 | Lazaridis et al. |
| 5,740,366 | A | 4/1998 | Mahany et al. |
| 5,744,366 | A | 4/1998 | Kricka et al. |
| 5,796,727 | A | 8/1998 | Harrison et al. |
| 5,839,051 | A | 11/1998 | Grimmett et al. |
| 5,940,771 | A | 8/1999 | Gollnick et al. |
| 6,014,705 | A | 1/2000 | Koenck et al. |
| 6,184,717 | B1 * | 2/2001 | Crick .......................... 326/86 |
| 6,278,312 | B1 * | 8/2001 | Dabral et al. ............... 327/310 |
| 6,374,311 | B1 | 4/2002 | Mahany et al. |
| 6,424,194 | B1 | 7/2002 | Hairapetian |
| 6,753,700 | B1 * | 6/2004 | Hairapetian .................. 326/86 |

OTHER PUBLICATIONS

Robert Meier's Master's Thesis, Mobile Computer Network Architecture, (May 1993), 82 pages.

Hoberecht, A Layered network Protocol for Packet Voice and Data Integration, IEEE Journal on Selected Areas in Communications, vol. SAC-1, No. 6 (Dec. 1983), pp. 1006-1013.

Rypinski, Architecture-Topology and Protocol Stacks, IEEE 802.11/91-21, Mar. 1991, 12 pages.

Cheah, A Proposed Architecture and Access Protocol Outline for the IEEE 802.11 Radio LAN Standards, Document IEEE P802.11/91-54, May 1991; pp. 1-20.

Rypinski, Power-Drain Considerations for Full Time and Sleep Mode Radio Receivers, IEEE P802.11/91-99, Sep. 1991, 11 pages.

Natarajan et al, Battery Efficient Operation of Radio MAC Protocol, IEEE P802.11/91-102, Sep. 1991, pp. 1-5.

Cox, A Radio System Proposal for Widespread Low-Power Tetherless Communications, IEEE Transactions on Communications, vol. 39, No. 2 (Feb. 1991), pp. 324-335.

Bagby, One Approach to Wireless Network Architecture, IEEE P802.11/91-2, Jan. 1991, 1-15, 17-21.

Biba, A Modest Proposal for a Asynchronous, Data Intensive, Wireless Local Area Network, IEEE P802.11/91-25, Mar. 1991; pp. 1-25.

Heimschi et al; Merged CMOS/Bipolar Current Switch Logic (MCSL), IEEE Journal of Solid State Circuits, vol. 24, pp. 1307-1311, Oct. 1989, pp. 1307-1311.

Elrabaa et al; Optimization of Digital BICMOS Circuits, An Overview, IEEE 1992, 5 pages, no month.

Mudd et al, Very High Speed ECL/CMG Gate Arrays with Submicron Structures; IEEE 1989, 5 pages, no month.

* cited by examiner

UNIVERSAL SINGLE-ENDED PARALLEL BUS

CROSS REFERENCE TO RELATED APPLICATIONS

The present U.S. Utility Patent Application is a continuation of U.S. Utility Patent Application Serial No. 10/179,735, entitled "Universal single-ended parallel bus," filed Jun. 24, 2002, is now U.S. Pat. No. 6,753,700 which is hereby incorporated herein by reference in its entirety and made part of the present U.S. Utility Patent Application for all purposes.

The above-referenced U.S. Utility patent application Ser. No. 10/179,735 is a continuation, of U.S. Utility patent application Ser. No. 09/605,091, entitled "Universal single-ended parallel bus," filed Jun. 27, 2000, now U.S. patent No. 6,424,177 B1, issued on Jul. 23, 2002, which claims priority from U.S. Provisional Patent Application Ser. No. 60/141,354, entitled "Universal single-ended parallel bus," filed on Jun. 28, 1999.

BACKGROUND OF THE INVENTION

The present invention relates in general to communication systems, and in particular to a communication system using single-ended parallel bus architecture for high speed data communication.

For high-speed chip to chip communication it is common to find both the clock and parallel data lines using fully differential architecture. The differential parallel bus architectures, however, requires twice the number of I/O's as compared to the single-ended bus architecture. To reduce the number of I/Os and bus interconnect lines it is desirable to use single-ended bus architectures. In high-speed communication systems, however, the signal swings are typically small, and in single-ended architectures it becomes necessary to define a reference signal which sets the threshold voltage of the I/O cells. This reference signal is used in both the transmitter as well as the receiver and is used to determine the logic state of the signal.

The use of a reference signal in a single-ended bus architectures works well as long as the reference voltage remains stable and accurate. Any variations in the reference signal results in duty cycle distortions. To improve the stability and accuracy of the reference signal, instead of having separate reference signal generators at each end of the channel (i.e., receiver and transmitter), the receiver is typically equipped with circuitry that extracts the reference level from the data. This method of reference extraction, however, still suffers from variations since the DC value of the received data can vary significantly depending on the data stream. There is therefore a need for data communication systems with improved single-ended bus structures.

SUMMARY OF THE INVENTION

The present invention provides a single-ended bus architecture for high speed data communication wherein a stable and accurate reference voltage minimizes duty cycle distortion. Broadly, a communication system according to the present invention includes a single-ended bus structure that is made up of a differential interconnect line that carries a differential periodic signal such as clock, and one or more single-ended data interconnect lines. The reference signal for the single-ended data lines is extracted from the differential clock signal. Given a clock signal with near 50% duty cycle, the stability of the extracted DC value is much improved.

Accordingly, in one embodiment, the present invention provides a communication system including a first integrated circuit configured to transmit data and a periodic signal; a bus coupled to the first integrated circuit, the bus having at least one differential interconnect line coupled to carry the periodic signal, and a single-ended interconnect line coupled to carry data; and a second integrated circuit configured to receive the data and the periodic signal, the second integrated circuit having a differential buffer coupled to receive the periodic signal and to extract a reference signal, and a data buffer coupled to receive the data and the reference signal.

In another embodiment, the present invention provides a method of communicating data including transmitting a differential periodic signal over differential lines in a communication bus; transmitting single-ended data over single-ended lines in the communication bus; and extracting a reference signal for the single-ended data from the differential periodic signal.

In yet another embodiment, the present invention provides an integrated circuit including a differential buffer coupled to receive a differential periodic signal and to extract a DC reference signal from the differential periodic signal; a data buffer coupled to receive a single-ended data signal and the reference signal, the data buffer being configured to determine a logic level of the single-ended data by comparing it to the reference signal.

The following detailed description and the accompanying drawings provide a better understanding of the nature and advantages of the method and circuitry for implementing a high speed communication system according to the present invention.

DESCRIPTION OF THE SPECIFIC EMBODIMENTS

The present invention provides a single-ended bus architecture for high speed data communication wherein a stable and accurate reference voltage minimizes duty cycle distortion. In many communication systems, the source of the data is the same circuit that supplies the clock signal. Thus, data and clock typically have the same logic levels (e.g., TTL, CMOS, etc.). Unlike data, however, clock is typically a signal with a 50% duty cycle and therefore has a much more stable DC value. According to a preferred embodiment of the present invention, the optimum reference voltage is extracted from the clock. This results in a much more accurate and stable reference voltage for use along with single-ended data lines.

Figure 1:
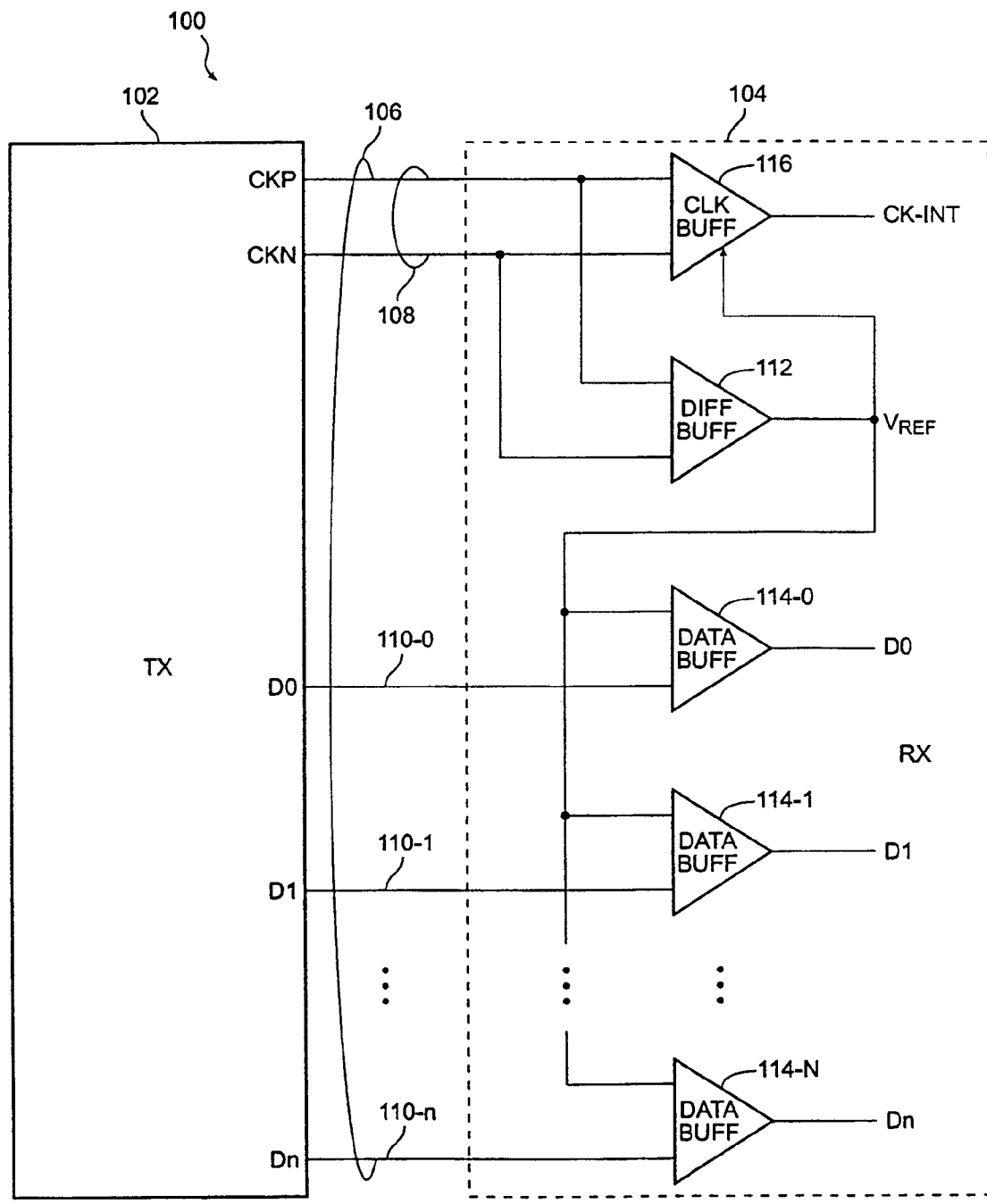
FIG. 1 is a high level block diagram of a communication system using the single-ended bus architecture according to the present invention.

FIG. 1 is a high level block diagram of a communication system 100 using the single-ended bus architecture according to the present invention. A transmitter integrated circuit (IC) 102 is connected to a receiver IC 104 via a communication bus 106. Integrated circuits 102 and 104 are identified herein as transmitter and receiver for simplicity, and may comprise other circuitry, for example, each being both a transmitter and a receiver (i.e., transceivers). In this embodiment, bus 106 has at least one differential line 108 which is used for carrying clock signal (CKN/CKP) with several other single-ended lines 110-0 to 110-n that carry data. Receiver IC 104 includes a differential buffer 112 that receives differential clock signal CKN/CKP and generates the reference signal $V_{REF}$ by extracting the DC value of the differential clock signal. Receiver IC 104 further includes data input buffers 114-0 to 114-n that receive data lines 110-0 to 110-n at their inputs, respectively. Each data input buffer 114-i is also supplied with the reference signal $V_{REF}$ generated by differential buffer 112. In one embodiment, the reference signal $V_{REF}$ is also supplied to a clock buffer 116 that is used to buffer the received differential clock signal CKN/CKP and to generate an internal clock signal CK_INT. Single-ended data is thus received and buffered using the reference signal extracted from the differential clock signal.

Figure 2:
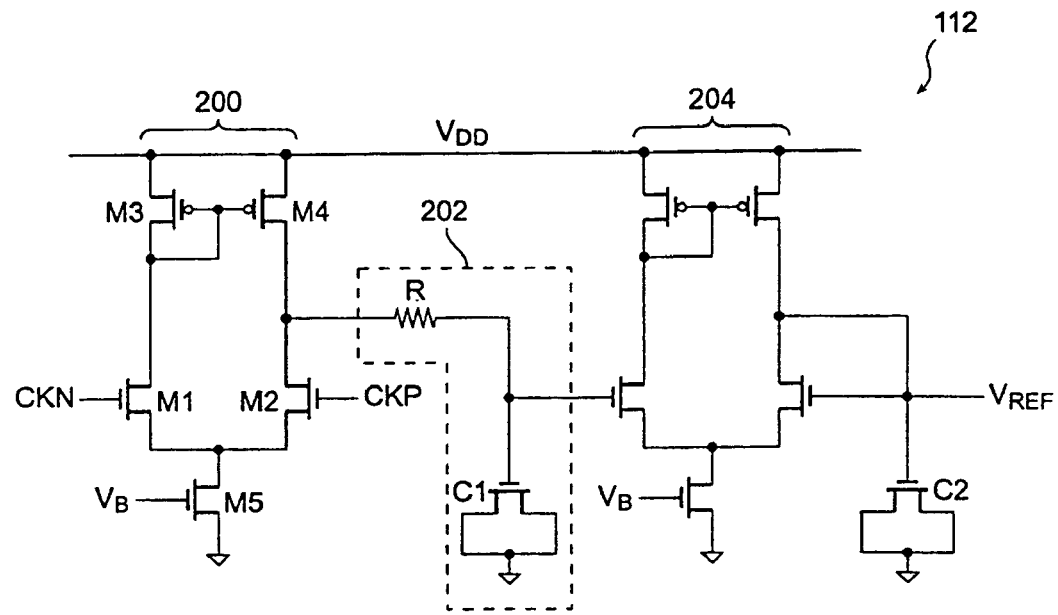
FIG. 2 shows a simplified circuit schematic for a reference signal extraction circuit according to an exemplary embodiment of the present invention.

Referring to FIG. 2, there is shown an exemplary circuit implementation for differential buffer 112 for extracting the reference signal $V_{REF}$ from the differential clock signal CKN/CKP. Buffer 112 includes an input differential pair 200 made-up of n-channel input MOS transistors M1 and M2 that receive the differential clock signal CKN/CKP at their respective gate terminals, p-channel load MOS transistors M3 and M4, and n-channel current-source MOS transistor M5. Differential clock signal CKN/CKP is buffered and amplified by input differential pair 200 at the output OUT1. Output OUT1 of input differential pair 200 is filtered by resistor R and capacitor C1 extracting the DC value of the differential clock signal. Resistor R may be made of any number of semiconductor materials such as polysilicon, and capacitor C1 may be made of any number of materials including, for example, an MOS structure as shown. A second differential pair 204 constructed similar to differential pair 200, provides buffering and generates $V_{REF}$ at its output.

Figure 3:
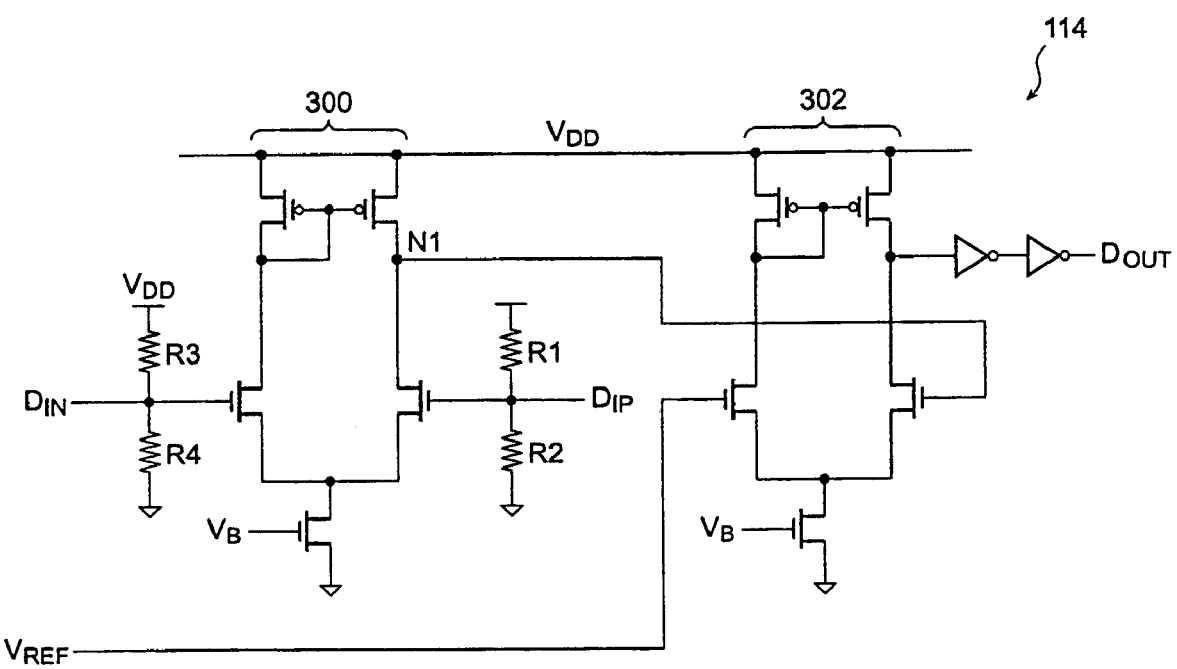
FIG. 3 is an exemplary circuit schematic for a data input buffer receiving single-ended data and the extracted reference signal.

FIG. 3 shows an exemplary circuit implementation for a data buffer according to the present invention. Data buffer 114 includes an input differential pair 300 that is capable of receiving either a differential data signal (Din and Dip) or a single-ended data signal (e.g., at input Dip). Resistors R1, R2, and R3, R4 respectively couple to the positive input Dip and negative input Din. These resistors provide for DC biasing of the input terminals. Once buffered by input differential pair 300, the data signal at the output node N1 is applied to one input of a comparator 302 that receives at another input the reference signal $V_{REF}$ extracted from the differential clock. By comparing the level of the data signal to $V_{REF}$, buffer 302 determines the logic level of the data signal. One or more inverters drive the output of comparator 302. It is to be understood that given a single-ended data line, data buffer 114 need not provide the capability to receive a differential signal. That is, input differential pair 300 may be a simple inverter receiving a single-ended signal.

The present invention thus provides a single-ended bus structure for high speed data communication systems wherein the reference signal is extracted from a differential periodic signal. The reference signal as thus extracted is much more stable and accurate minimizing distortion in the duty cycle of the data signal. While the above provides a complete description of specific embodiments of the present invention, it is possible to use various alternatives, modifications and equivalents. For example, while the differential signal has been identified as clock, the advantages of the present invention can be obtained with any periodic signal, whether defined as clock or another signal. Also, the number of differential and single-ended interconnect lines in the bus according to the present invention may vary depending on the system requirements. Therefore, the scope of the present invention should be determined not with reference to the above description but should, instead, be determined with reference to the appended claims, along with their full scope of equivalents.

What is claimed is:

1. A receiver, comprising:
a first buffer that is operable to receive a first signal and to process the first signal thereby generating a reference signal, wherein the first signal is a differential signal; and
a second buffer that is operable to receive a second signal and to compare a level of the second signal to the reference signal to determine a logic level of the second signal.

2. The receiver of claim 1, wherein:
the second signal is a single-ended signal.

3. The receiver of claim 1, wherein:
the first signal is a differential clock signal; and
the second signal is a single-ended data signal.

4. The receiver of claim 1, wherein:
the second buffer includes a differential pair that includes:
a current source;
a first differential NMOS transistor having a source, gate, and drain, wherein the source of the first differential NMOS transistor is coupled to the current source;
a second differential NMOS transistor having a source, gate, and drain, wherein the source of the second differential NMOS transistor is coupled to the current source;
the second signal is provided to the gate of the second differential NMOS transistor; and
a buffered version of the second signal is output from the drain of the second differential NMOS transistor.

5. The receiver of claim 4, wherein:
a first resistor is communicatively coupled from the gate of the first differential transistor to a first voltage level;
a second resistor is communicatively coupled from the gate of the first differential transistor to a second voltage level;
a third resistor is communicatively coupled from the gate of the second differential transistor to the first voltage level; and
a fourth resistor is communicatively coupled from the gate of the second differential transistor to the second voltage level.

6. The receiver of claim 1, wherein:
the second buffer includes a differential pair that includes:
a current source;
a first differential NMOS transistor having a source, gate, and drain, wherein the source of the first differential NMOS transistor is coupled to the current source;
a second differential NMOS transistor having a source, gate, and drain, wherein the source of the second differential NMOS transistor is coupled to the current source;
a buffered version of the second signal is provided to the gate of the second differential NMOS transistor;

the reference signal is provided to the gate of the first differential NMOS transistor;
the logic level of the second signal corresponds to a voltage level at the drain of the second differential NMOS transistor.

7. The receiver of claim 1, wherein:
the first buffer includes a differential pair that includes:
   a current source;
   a first differential NMOS transistor having a source, gate, and drain, wherein the source of the first differential NMOS transistor is coupled to the current source;
   a second differential NMOS transistor having a source, gate, and drain, wherein the source of the second differential NMOS transistor is coupled to the current source;
a first differential component of the differential signal is provided to the gate of the first differential NMOS transistor;
a second differential component of the differential signal is provided to the gate of the second differential NMOS transistor; and
a buffered, single-ended signal that corresponds to the first signal is output from the drain of the second differential NMOS transistor.

8. The receiver of claim 7, wherein:
the first buffer includes a filter that filters the buffered, single-ended signal that corresponds to the first signal thereby extracting a DC level of the first signal there from.

9. The receiver of claim 1, wherein:
the first buffer includes a differential pair that includes:
   a current source;
   a first differential NMOS transistor having a source, gate, and drain, wherein the source of the first differential NMOS transistor is coupled to the current source;
   a second differential NMOS transistor having a source, gate, and drain, wherein the source of the second differential NMOS transistor is coupled to the current source, and wherein the gate and the drain of the second differential NMOS transistor are communicatively coupled;
a DC level that corresponds to the first signal is provided to the gate of the first differential NMOS transistor; and
the reference signal is output from the gate or the drain of the second differential NMOS transistor.

10. The receiver of claim 1, further comprising:
a third buffer that is operable to receive a third signal and to compare a level of the third signal to the reference signal to determine a logic level of the third signal.

11. A communication system, comprising:
a transmitter that is operable to transmit a first signal and a second signal, wherein the first signal is a differential signal;
a receiver that includes a first buffer and a second buffer;
wherein the transmitter and the receiver are communicatively coupled via a bus;
wherein the first buffer is operable to receive the first signal from the bus and to process the first signal thereby generating a reference signal; and
wherein the second buffer is operable to receive the second signal from the bus and to compare a level of the second signal to the reference signal to determine a logic level of the second signal.

12. The communication system of claim 11, wherein:
the bus is operable to convey at least one differential signal and at least one single-ended signal; and
the second signal is a single-ended signal.

13. The communication system of claim 11, wherein:
the bus is operable to convey at least one differential signal and at least one single-ended signal;
the first signal is a differential clock signal; and
the second signal is a single-ended data signal.

14. The communication system of claim 11, wherein:
the second buffer includes a first differential pair that includes:
   a current source;
   a first differential NMOS transistor having a source, gate, and drain, wherein the source of the first differential NMOS transistor is coupled to the current source;
   a second differential NMOS transistor having a source, gate, and drain, wherein the source of the second differential NMOS transistor is coupled to the current source;
the second buffer includes a second differential pair that includes:
   a current source;
   a first differential NMOS transistor having a source, gate, and drain, wherein the source of the first differential NMOS transistor is coupled to the current source;
   a second differential NMOS transistor having a source, gate, and drain, wherein the source of the second differential NMOS transistor is coupled to the current source;
the second signal is provided to the gate of the second differential NMOS transistor of the first differential pair;
a buffered version of the second signal is output from the drain of the second differential NMOS transistor of the first differential pair and is provided to the gate of the second differential NMOS transistor of the second differential pair;
the reference signal is provided to the gate of the first differential NMOS transistor of the second differential pair;
the logic level of the second signal corresponds to a voltage level at the drain of the second differential NMOS transistor of the second differential pair.

15. The communication system of claim 11, wherein:
the second signal is a single-ended signal;
the first buffer includes a first differential pair that includes:
   a current source;
   a first differential NMOS transistor having a source, gate, and drain, wherein the source of the first differential NMOS transistor is coupled to the current source;
   a second differential NMOS transistor having a source, gate, and drain, wherein the source of the second differential NMOS transistor is coupled to the current source;
the first buffer includes a second differential pair that includes:
   a current source;
   a first differential NMOS transistor having a source, gate, and drain, wherein the source of the first differential NMOS transistor is coupled to the current source;

a second differential NMOS transistor having a source, gate, and drain, wherein the source of the second differential NMOS transistor is coupled to the current source, and wherein the gate and the drain of the second differential NMOS transistor of the second differential pair are communicatively coupled;

a first differential component of the differential signal is provided to the gate of the first differential NMOS transistor of the first differential pair;

a second differential component of the differential signal is provided to the gate of the second differential NMOS transistor of the first differential pair;

a buffered, single-ended signal that corresponds to the first signal is output from the drain of the second differential NMOS transistor of the first differential pair;

the first buffer includes a filter that filters the buffered, single-ended signal that corresponds to the first signal thereby extracting a DC level of the first signal there from;

the DC level of the first signal is provided to the gate of the first differential NMOS transistor of the second differential pair; and the reference signal is output from the gate or the drain of the second differential NMOS transistor of the second differential pair.

16. The communication system of claim 11, wherein:

the receiver includes a third buffer that is operable to receive a third signal and to compare a level of the third signal to the reference signal to determine a logic level of the third signal.

17. An integrated circuit, comprising:

a first functional block that is operable to receive a first signal and to process the first signal thereby generating a second signal, wherein the first signal is a differential signal;

a second functional block that is operable to receive a third signal and to process the third signal thereby generating a fourth signal; and wherein the second functional block is operable to compare the fourth signal and the second signal to determine bit values within the third signal.

18. The integrated circuit of claim 17, wherein:

the first signal is a substantially periodic differential signal; and the first functional block includes a first differential pair that receives and buffers the first signal thereby generating a first single-ended output signal;

the first functional block includes a filter that filters the first single-ended output signal thereby extracting a DC level of the first signal there from; and the first functional block includes a second differential pair that uses the DC level of the first signal to generate the second signal.

19. The integrated circuit of claim 17, wherein:

the third signal is a single-ended signal; and the second functional block includes a first differential pair that receives and buffers the third signal thereby generating the fourth signal; and the second functional block includes a second differential pair that is operable to compare the fourth signal and the second signal to determine bit values within the third signal.

20. The integrated circuit of claim 17, wherein:

the first signal is a substantially periodic differential signal;

the second signal is a DC voltage level that corresponds to the substantially periodic differential signal;

the third signal is a single-ended data signal; and the fourth signal is a buffered version of the third signal.

* * * * *